(12) United States Patent
Beaujard

(10) Patent No.: US 7,271,714 B2
(45) Date of Patent: Sep. 18, 2007

(54) PUSH BUTTON CONTROL DEVICE

(75) Inventor: Jean-Philippe Beaujard, Plaisance du Touch (FR)

(73) Assignee: Airbus France, Toulouse (FR)

( * ) Notice: Subject to any disclaimer, the term of this patent is extended or adjusted under 35 U.S.C. 154(b) by 182 days.

(21) Appl. No.: 11/132,287

(22) Filed: May 19, 2005

(65) Prior Publication Data

US 2005/0263383 A1   Dec. 1, 2005

(30) Foreign Application Priority Data

May 28, 2004   (FR) .................................. 04 51060

(51) Int. Cl.
   *G08B 29/00*   (2006.01)
(52) U.S. Cl. ...................... 340/514; 340/644; 340/652; 340/686.1; 340/687
(58) Field of Classification Search ................ 340/514, 340/635, 644, 652, 686.1, 687
   See application file for complete search history.

(56) References Cited

U.S. PATENT DOCUMENTS

| | | | | | |
|---|---|---|---|---|---|
| 3,956,589 | A | * | 5/1976 | Weathers et al. | 370/296 |
| 4,467,270 | A | * | 8/1984 | McElroy et al. | 324/503 |
| 4,680,761 | A | * | 7/1987 | Burkness | 714/724 |

FOREIGN PATENT DOCUMENTS

| | | |
|---|---|---|
| FR | 2 815 126 | 4/2002 |
| FR | 2 832 219 | 5/2003 |
| GB | 2 053 484 A | 2/1981 |

* cited by examiner

*Primary Examiner*—Daryl C Pope
(74) *Attorney, Agent, or Firm*—Oblon, Spivak, McClelland, Maier & Neustadt, P.C.

(57) ABSTRACT

This invention relates to a two stage push button control device, in which the push button (9) has at least one of its inputs (A, C) connected to the output of a processing organ (15) and its two outputs (B, D) connected to two inputs (E1, E2) of this processing organ (15).

20 Claims, 3 Drawing Sheets

PUSH BUTTON CONTROL DEVICE

TECHNICAL FIELD

This invention relates to a push button control device, that may be used in particular for aircraft ground maintenance tests.

STATE OF THE PRIOR TECHNIQUE

The push button control device has two stages in the known art, illustrated in FIG. 1 showing a push button 9 whose mobile conductive part 10 moves between two contacts A and B, and two contacts, C and D, a return spring 11 which pulls this mobile part 10 towards the contacts A and B. In the rest position, the contacts A and B have an earth connection, and the contact D is in an open circuit. In the thrust position 12 of the mobile part, where the return spring 11 is compressed, the contacts C and D are connected to the earth, and the contact B is in an open circuit.

Such a device can be subject to breakdowns, for example unplanned earthing.

The purpose of the invention is to define an architecture around a two stage push button permitting the detection of electrical and mechanical breakdowns, whilst maintaining an adequate level of electrical segregation between the two stages, such architecture being able to be used on an aircraft for ground maintenance tests or for tests on an aircraft being built on an assembly line.

DESCRIPTION OF THE INVENTION

The invention relates to a two stage push button control device, characterised in that the push button has at least one of its two inputs connected to the output of a processing organ and its two outputs connected to two inputs of this processing organ.

The push button may have its two inputs connected to the output of the processing organ.

Advantageously, the processing organ provides an output of a discrete signal that is a breakdown test echo signal, which corresponds to an open circuit when there is a breakdown in the processing organ. The discrete signal may be a breakdown test echo signal when the push button is pressed.

This push button advantageously permits clear breakdowns to be detected: short-circuits, breaks, etc. . . . as well as oscillatory breakdowns: repeated faulty contacts (repetitive cycles of open circuits then short -circuits).

In one embodiment, the processing organ comprises two redundant computers of which at least one output is connected to at least one input of the push button.

The device of the invention may be used in particular for aircraft ground maintenance tests. It may also be used for testing an aircraft on an assembly line.

DETAILED DESCRIPTION OF SPECIFIC EMBODIMENTS

Figure 1:
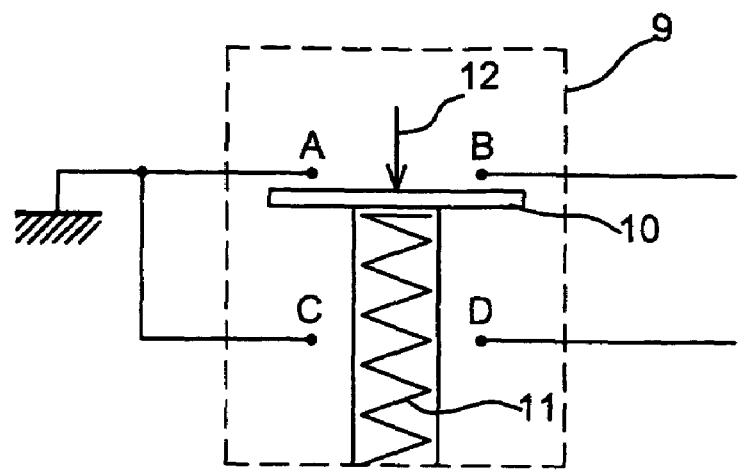
FIG. 1 illustrates a push button control device of the prior art.
Figure 2:
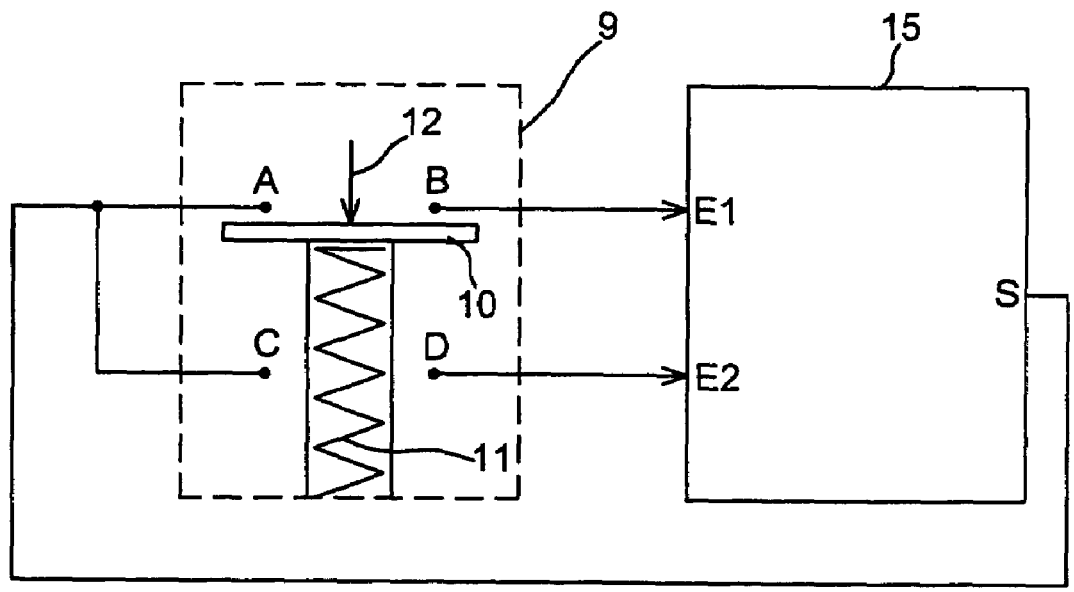
FIG. 2 illustrates a push button control device of the invention.

In the device of the known art, illustrated in FIG. 1, the common point A-C is connected to the earth. In the device of this invention, as illustrated in FIG. 2, at least one of the points A, C, which is an input point of the push button 9, receives a discrete signal issued by a computer 15.

In one advantageous embodiment, the common point A-C is wired to one or more discrete on-board computer outputs, the piloting of these outputs permits electrical or mechanical breakdowns of the push button to be detected.

The common point A-C is thus wired to another point other than the earth to receive a discrete signal dso, which may be an echo signal of a breakdown test carried out on the said device.

It is therefore possible to carry out an automatic test over a short period in this way. This test may advantageously be made every time that the operator presses the push button.

Figure 3:
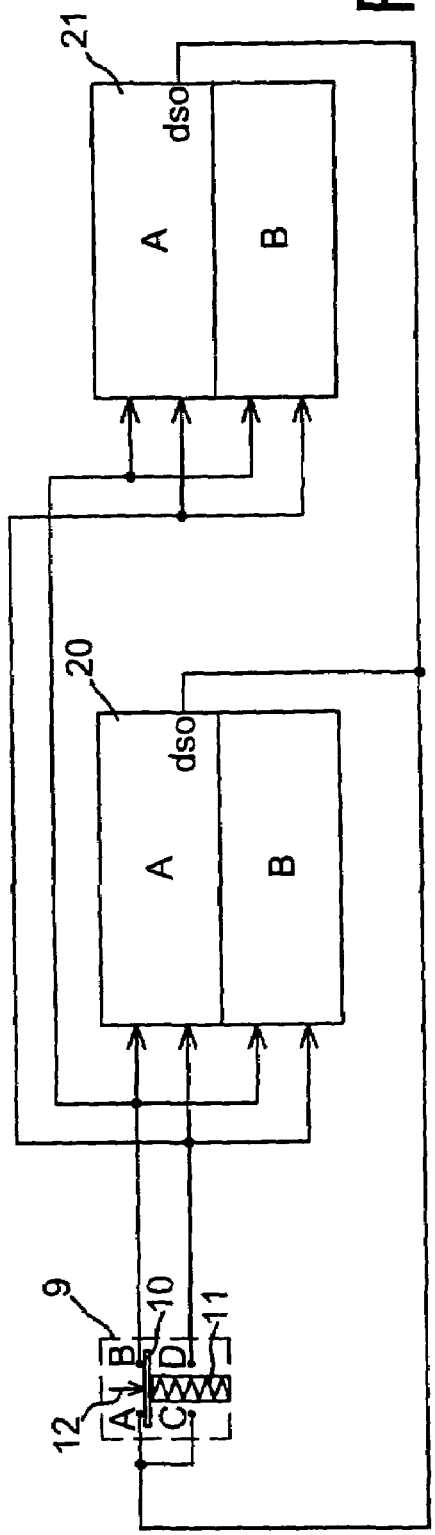
FIGS. 3 to 5 illustrate embodiments of the device of the invention.

Such a test is compatible with the use of two computers 20 and 21 which operate redundantly, as illustrated in FIG. 3. The two calculation units of each computer have the inputs of their two stages connected to the contacts B and D and their output dso connected to the common point A-C. The dso corresponds to an open circuit when there is a breakdown of a computer.

These computers 20 and 21 may also be primary flight control computers. When there is a breakdown, the back-up computer 21 can thus take over from the first computer 20.

There is consequently redundancy of acquisition on the push button.

Figure 4:
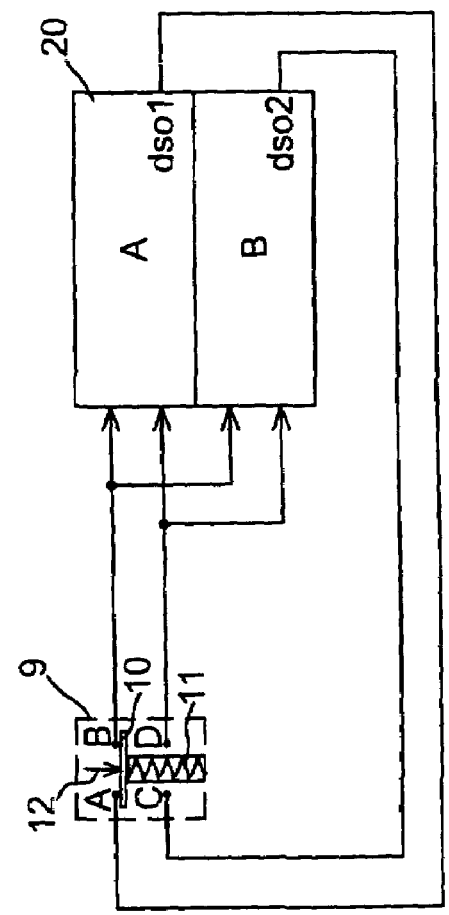

As illustrated in FIG. 4, the dso signal may also be separated into a discrete dso1 signal at the output of the first calculation unit 20 and into a discrete dso2 signal at the output of the second calculation unit 21 of the computer.

It is thus possible to receive these two discrete signals dso1 and dso2 respectively at points A and C with, for example, at point A, a test signal then earthing, and for the other point, for example point C, a test signal then an open circuit.

Figure 5:
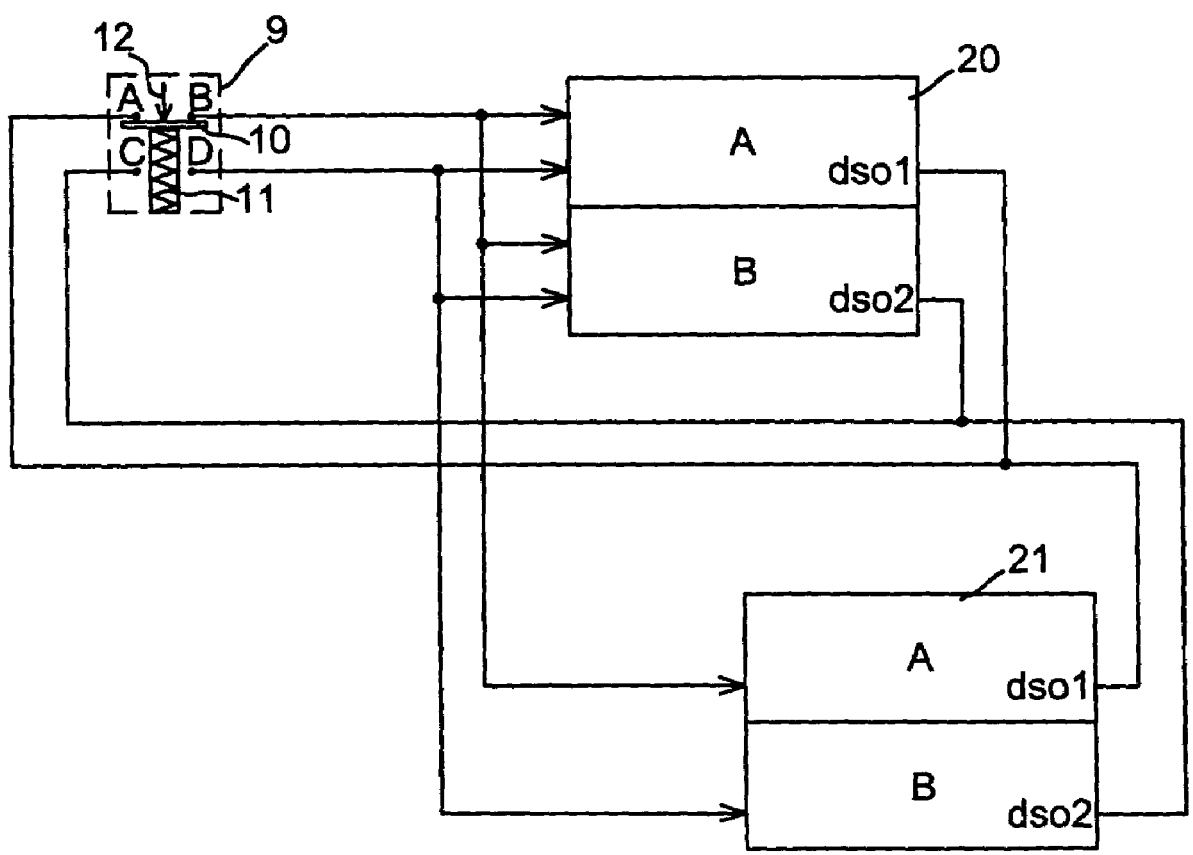

As illustrated in FIG. 5, the dso signal may be separated into a dso1 signal at the output of a first calculation unit and into a dso2 signal at the output of a second calculation unit, for the output from both computers 20 and 21.

The invention claimed is:

1. A two stage push button control device comprising:
   a processing device including two inputs and at least one output; and
   a push button including two inputs and two outputs, wherein at least one of said two inputs of said push button is connected to the at least one output of the processing device and said two outputs of said push button are connected to said two inputs of said processing device.

2. The device of claim 1, wherein the two inputs of said push button are connected to the at least one output of the processing device.

3. The device of claim 1, wherein the processing device is configured to supply a discrete output signal that is a breakdown test echo signal, which corresponds to an open circuit when there is a breakdown of the processing device.

4. The device of claim 3, wherein the discrete output signal is a breakdown test echo signal when the push button is pressed.

5. The device of claim 1, wherein the processing device comprises two redundant computers of which at least one output is connected to at least one input of the push button.

6. The device of claim 1, wherein the processing device has at least two outputs connected to at least one input of the push button.

7. Application of the device of the claim 1 for aircraft ground maintenance tests.

8. Application of the device according to the claim 1 for tests on an aircraft being built on an assembly line.

9. The device of claim 1, wherein the push button comprises a mobile conductive part configured to move from a first position to a second position,
   wherein in said first position, said mobile conductive part connects a first of said two inputs of said push button to a first of said two outputs of said push button, and
   wherein in said second position, said mobile conductive part connects a second of said two inputs of said push button to a second of said two outputs of said push button.

10. A method of performing an aircraft ground maintenance test, said method comprising moving the mobile conductive part of the device according to claim 9 from said first position to said second position.

11. An aircraft comprising the device of claim 1.

12. The aircraft of claim 11, wherein said processing device comprises a portion of a flight control computer for said aircraft.

13. The aircraft of claim 11, wherein said processing device comprises two computers, of which one is a primary flight control computer, and another one is a back-up computer for said primary flight control computer.

14. The device of claim 1, wherein the push button has only two inputs.

15. The device of claim 14, wherein the push button has only two outputs.

16. A two stage push button control device comprising:
   a processing device including two inputs and at least one output; and
   a push button including two outputs and an input connected to the at least one output of the processing device and wherein said two outputs of said push button are connected to said two inputs of said processing device;
   wherein the processing device is configured to supply an output signal that is a breakdown test echo signal.

17. The device of claim 16, wherein said breakdown test echo signal corresponds to an open circuit when there is a breakdown of the processing device.

18. The device of claim 16, wherein the output signal is a breakdown test echo signal when the push button is pressed.

19. A two stage push button control device comprising:
   a processing device including two inputs and at least one output; and
   a push button including two outputs and an input connected to the at least one output of the processing device and wherein said two outputs of said push button are connected to said two inputs of said processing device;
   wherein the processing device comprises two redundant computers of which an output is connected to the input of the push button.

20. A two stage push button control device comprising:
   a processing device including two inputs and at least one output; and
   a push button including two outputs and an input connected to the at least one output of the processing device and wherein said two outputs of said push button are connected to said two inputs of said processing device;
   wherein the processing device has at least two outputs connected to said input of the push button.

* * * * *